(12) United States Patent
Hirano et al.

(10) Patent No.: US 6,215,250 B1
(45) Date of Patent: Apr. 10, 2001

(54) OPTICAL ELEMENT

(75) Inventors: Takashi Hirano; Tatsuya Sasaoka; Mitsunobu Sekiya; Naoki Sano, all of Kanagawa; Tetsuo Nakayama, Tokyo, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/365,905

(22) Filed: Aug. 3, 1999

(30) Foreign Application Priority Data

Aug. 4, 1998 (JP) .................................................. 10-220003

(51) Int. Cl.[7] ...................................................... G09G 3/10
(52) U.S. Cl. ...................................... 315/169.3; 315/169.1
(58) Field of Search ................................. 315/169.3, 167, 315/169.1; D18/26; 313/504, 505, 506; 345/76, 77, 78

(56) References Cited

U.S. PATENT DOCUMENTS

| 4,743,808 | * | 5/1988 | Mitsumori | 315/169.3 |
| 5,053,675 | * | 10/1991 | Thioulouse | 313/505 |
| 5,886,474 | * | 3/1999 | Asai et al. | 315/169.1 |
| 5,896,006 | * | 4/1999 | Kusaka et al. | 313/506 |
| 5,909,081 | * | 6/1999 | Eida et al. | 313/504 |
| 5,962,970 | * | 10/1999 | Yokoi et al. | 313/506 |
| 6,034,481 | * | 3/2000 | Haynes | 315/169.3 |

* cited by examiner

Primary Examiner—Don Wong
Assistant Examiner—Trinh Do Dinh
(74) Attorney, Agent, or Firm—Sonnenschein, Nath & Rosenthal

(57) ABSTRACT

To provide an optical element in which resistance of electrodes on a scanning side is reduced, a rate of effectively utilizing light generated at organic layers is promoted and shortcircuit between anodes and cathodes is prevented, there is provided an optical element including first electrodes formed on a substrate, organic layers at least including organic light emitting materials formed on the first electrodes and second electrodes formed on the organic layers, in which the first electrodes and the second electrodes are formed to be substantially orthogonal to each other and the organic layers are formed in an island-like shape at positions at which the first electrodes and the second electrodes intersect with each other.

17 Claims, 7 Drawing Sheets

OPTICAL ELEMENT

BACKGROUND OF THE INVENTION

1. Field of the Invention

The present invention relates to an optical element including an organic light emitting layer and an organic EL (electroluminescence) display having organic electroluminescent elements.

2. Description of the Related Art

According to an organic EL display having a number of pixels each constituted by an organic electroluminescent element (hereinafter, referred to as organic EL element), voltage is applied to each of the organic EL elements, electrons are injected from a cathode thereof and holes are injected from an anode thereof respectively to an organic light emitting layer and light is emitted by causing recombination of electrons and holes in the organic light emitting layer.

Figure 9:
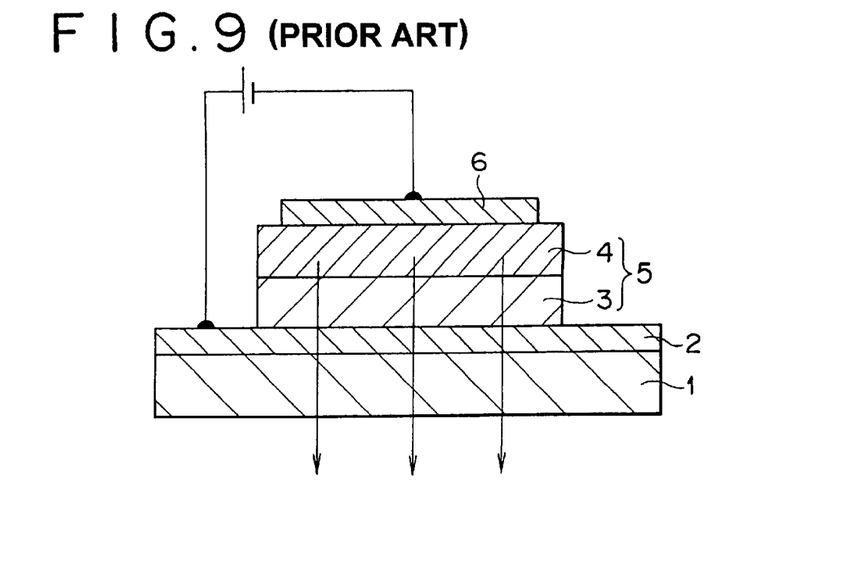
FIG. 9 is a side sectional view showing an outline constitution of a conventional single hetero-structure type organic EL element.

As such an organic EL element provided to an organic EL display, for example, there is a single hetero-structure type organic EL element shown by FIG. 9. According to the organic EL element, an anode 2 comprising a transparent conductive film made of ITO (Indium tin oxide) or the like is provided on a transparent substrate 1 of a glass substrate or the like, on which an organic layer 5 comprising a hole transport layer 3 and a light emitting layer 4 and a cathode 6 made of aluminum or the like are provided in this order.

Further, according to the EL element constituted in this way, when positive voltage is applied to the anode 2 and negative voltage is applied to the cathode 6, holes injected from the anode 2 reach the light emitting layer 4 via the hole transport layer 3 and electrons injected from the cathode 6 reach the light emitting layer 4, respectively and recombination of electrons and holes is caused in the light emitting layer 4. At this occasion, light having a predetermined wavelength is generated and is emitted from a side of the transparent substrate 1 to outside as shown by arrow marks in FIG. 9.

Accordingly, by arranging a number of the organic EL elements in, for example, a matrix-like shape, an organic EL display is formed as mentioned above.

Figure 10:
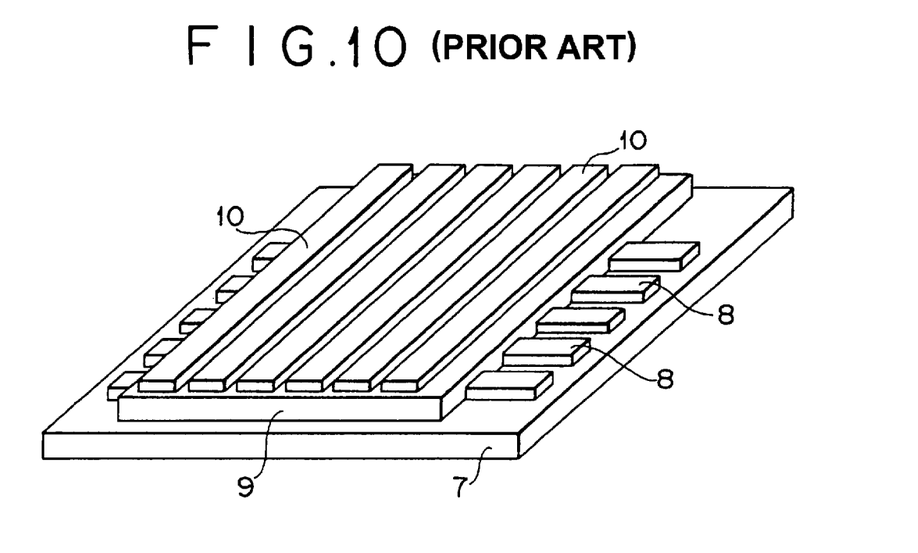
FIG. 10 is a perspective view showing an outline constitution of an example of a conventional organic EL display.

FIG. 10 shows an example of such a conventional organic EL display. The organic EL display shown by FIG. 10 is constituted such that a plurality of transparent electrodes 8 in a stripe-like shape (band-like shape) are provided on a transparent substrate 7, an organic layer 9 in a sheet-like shape constituted by laminating a hole transport layer and a light emitting layer are provided on the transparent electrodes 8 and a plurality of cathodes 10 in a stripe-like shape (band-like shape) are provided on the organic layer 9 to be orthogonal to the transparent electrodes 8 and organic EL elements are formed at positions where the transparent electrodes 8 and the cathodes 10 intersect with each other.

Figure 11:
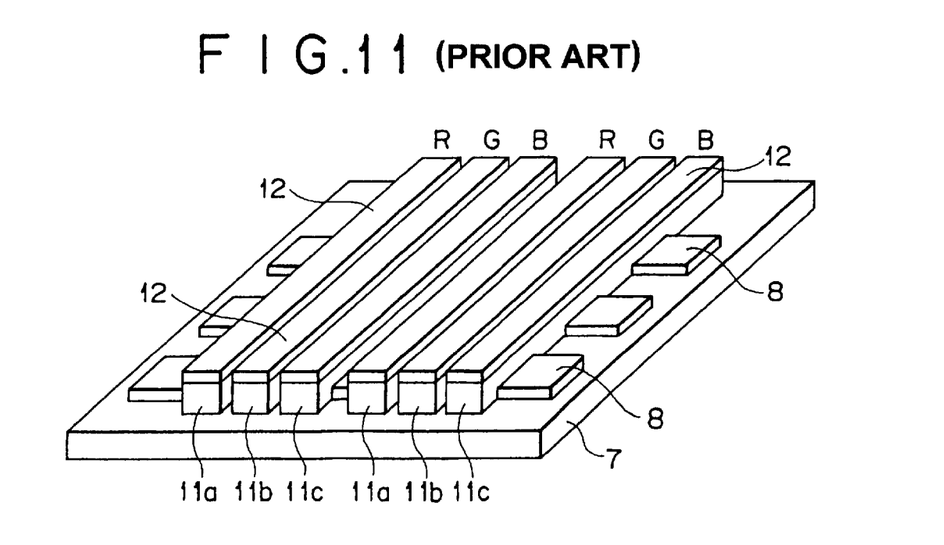
FIG. 11 is a perspective view showing an outline constitution of other example of a conventional organic EL display.

FIG. 11 is a view showing other example of a conventional organic EL display. The organic EL display shown by FIG. 11 is constituted such that the transparent electrodes 8 in a stripe-like shape are provided as anodes on the transparent substrate 7, organic layers 11a, 11b and 11c in a stripe-like shape each comprising a hole transport layer and a light emitting layer are provided on the transparent electrodes 8 in a state in which the organic layers and the transparent electrodes 8 are orthogonal to each other and cathodes 12 in a stripe-like shape having dimensions substantially equal to dimensions of the organic layers 11a, (11b and 11c) are provided on the organic layers, 11a, 11d and 11c. In this case, each of the organic layers 11a, 11b and 11c is provided with a light emitting characteristic in correspondence with one of red (R), green (G) and blue (B) by which the organic EL display constitutes a display of full color or multiple color.

Figure 12:
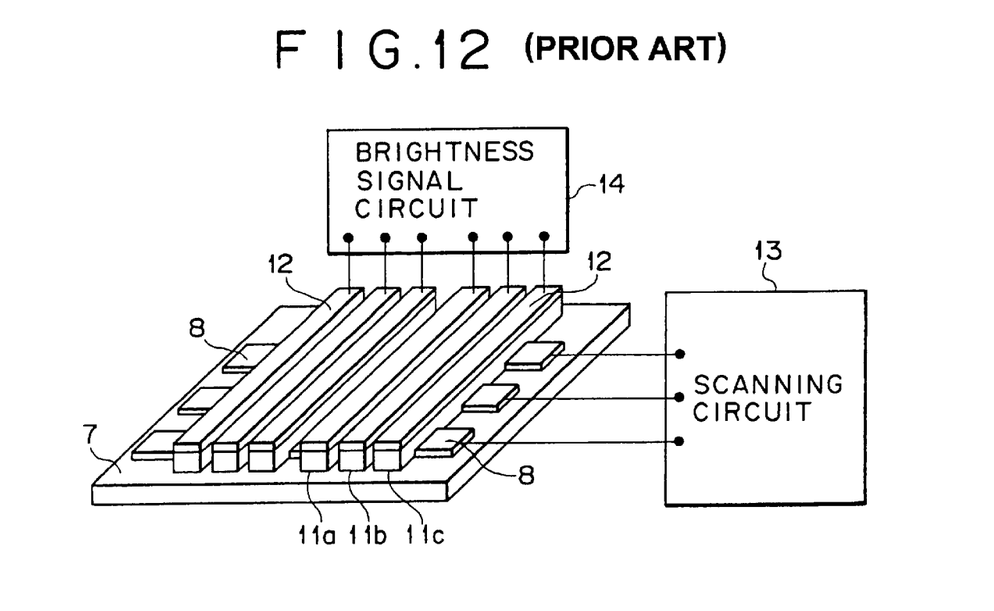
FIG. 12 is a perspective view showing a state of being connected with a drive circuit of the organic EL display shown by FIG. 11.

An explanation will be given of image display by the color organic EL display shown by FIG. 11. According to the color organic EL display, as shown by FIG. 12, a scanning circuit 13 is connected to the transparent electrodes 8 and a brightness signal circuit 14 is connected to the cathodes 12. Further, the organic layers 11a, 11b and 11c respectively emit light by time-sequentially applying signal voltages to the organic layers 11a, 11b and 11c at positions intersecting with the transparent electrodes 8 and the cathodes 12 by the scanning circuit 13 and the brightness signal circuit 14. Accordingly, the organic EL display functions as an image reproducing apparatus by such a control.

However, there is the following inconvenience in the organic EL display.

In the case in which the organic EL display is driven by, for example, the simple matrix system, when a number of scanning lines is several hundreds, in order to ensure sufficient brightness, current of about 1 A/cm$^2$ need to flow. Then, in this case, although it differs depending also on the size of the display, current of about 0.5 through 1 A is flowed instantaneously in the transparent electrodes 8 connected to the scanning circuit 13.

Further, the resistance value of ITO which is normally used for the transparent electrode 8 is about 100 times as much as that of a metal of aluminum or the like and its alloy. Accordingly, when large current of about 0.5 through 1 A is flowed as mentioned above, voltage drop in the transparent electrode 8 is increased. Further, when such a large voltage drop is caused in the transparent electrode 8, voltage applied on the respective organic EL elements in the organic EL display becomes nonuniform and the display function of the organic EL display is significantly deteriorated.

That is, when the organic EL display is driven by the simple matrix system, although depending also on the display size, current flowing in the electrodes on the scanning side becomes 100 through 1000 times as much as current flowing in the electrodes on the brightness signal side in view of the drive principle. However, in the case of the organic EL display, large current is flowed in the transparent electrode 8 having high resistance. Therefore, large voltage drop is caused in a transparent conductive film constituting the transparent electrode 8. Voltage applied on the organic layers 11a, 11b and 11c constituting the respective pixels becomes nonuniform by which the display function is deteriorated and power consumption in the transparent electrode 8 is increased.

Further, in the case of the color organic EL display shown by FIG. 11, the organic layers 11a, 11b and 11c are formed over an entire lower face thereof along the length direction of the cathodes 12 formed in a stripe-like shape. Owing to such a structure, brightness signals necessary for respective colors of R, G and B must be provided from the cathodes 12. Therefore, the brightness signal circuit 14 must be connected to the cathodes 12 and the scanning circuit 13 must be connected to the transparent electrodes 8.

Further, as mentioned above, power consumed in the transparent electrodes 8 is increased and accordingly, low power consumption formation in the entire organic EL display is deteriorated. Accordingly, to provide the organic EL display having low power consumption, the resistance of electrodes on the scanning side needs to reduce to thereby reduce voltage drop.

As a measure for reducing the resistance of the scanning side electrodes, there is disclosed a technology in which metal wirings are installed along with the transparent electrodes in JP-A-5-307997. According to the technology, a metal having low resistance is provided at a portion between the transparent electrode and the organic layer to thereby achieve low resistance formation of the scanning electrode.

However, in order to achieve sufficient low resistance formation by such a technology, an area of the metal wiring provided along with the transparent electrode needs to magnify as large as possible. When the area of the metal wiring is magnified in such a manner, the metal wiring covers the organic layers 11a, 11b and 11c constituting light emitting portions, as a result, the light emitting area of the organic EL element is reduced and the light emitting efficiency is deteriorated.

Further, although it is conceivable to achieve low resistance formation by enlarging the film thickness of metal, in such a case, there causes a concern of bringing about shortcircuit between the anode and the cathode and nonuniformity in the film thickness of the organic layer.

Further, according to the conventional organic EL display shown by FIG. 10 and FIG. 11, the organic layer 9 (11) is formed over an entire face or formed continuously along the length direction of the cathode 12. The organic layer 9 (11) is provided with light guiding performance and accordingly, a portion of light generated in the organic layer 9 (11) is propagated in the organic layer 9 (11) and is guided in the transverse direction relative to the transparent substrate 7 as shown by arrow marks C in FIG. 13. Then, the portion of light is attenuated in the guiding operation and the remaining portion is lost by being emitted from peripheral pixels.

That is, it is preferable that all of light generated in the organic layer 9 (11) is emitted to outside of the organic EL display by transmitting through the transparent electrodes 8 and the transparent substrate 7 and utilized as display light. However, according to the structure of the conventional organic EL display, a portion of light generated in the organic layer 9 (11) is not utilized as display light by which the efficiency of utilizing light is deteriorated and the brightness is reduced.

Further, a portion of light transmitted through the organic layer 9 (11) and guided in the transverse direction relative to the transparent substrate 7, is emitted to outside of the transparent substrate 7 by being emitted from the organic layer 9 (11) constituting peripheral pixels by which light originally generated at the peripheral pixels is interfered by the guided light and there also is a concern in which cross talk is caused and color reproducing performance is deteriorated.

Therefore, according to the conventional organic EL display, it is difficult to provide sufficient brightness and the color reproducing performance and in order to provide excellent display function, it is necessary to prevent light transmitting through the organic layer from being guided.

Figure 13:
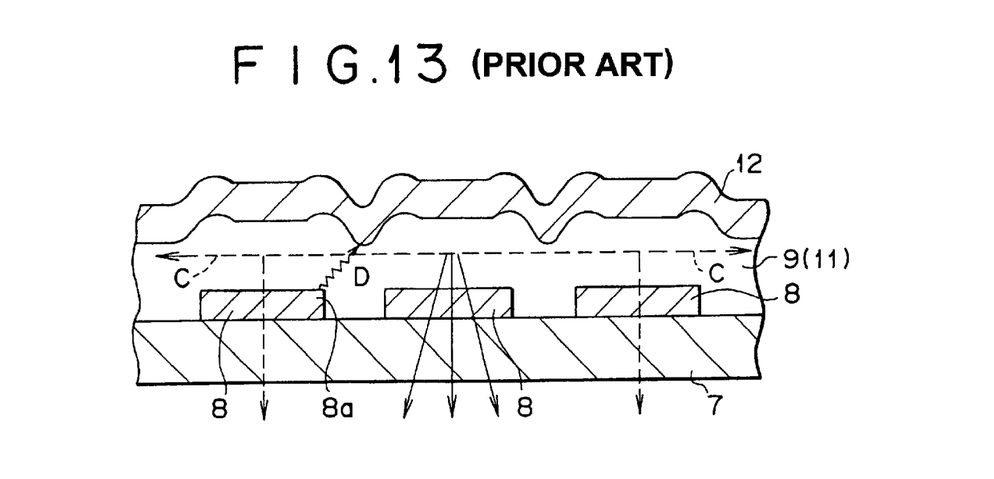
FIG. 13 is a side sectional view showing essential portions for explaining the problem of the conventional organic EL display.

Further, according to the conventional organic EL display, the organic layer 9 (11) at a surrounding of an end portion 8a in the width direction of the transparent electrode 8 is electrically fragile and accordingly, as shown by an arrow mark D in FIG. 13, shortcircuit is caused between the anode (transparent electrode) and the cathode 10 (12) and pixels cannot be selected.

SUMMARY OF THE INVENTION

The present invention has been carried out in view of the above-described situation and it is an object of the present inventions to provide an optical element in which resistance of electrodes on a scanning side can be reduced, a rate of effectively utilizing light generated at the organic layers is promoted and shortcircuit between anodes and cathodes is prevented and to provide an organic EL display in use thereof.

According to a first aspect of the invention, there is provided an optical element comprising first electrodes formed on a substrate, organic layers at least including organic light emitting materials formed on the first electrodes and second electrodes formed on the organic layers, wherein the first electrodes and the second electrodes are formed to be substantially orthogonal to each other and wherein the organic layers are formed in an island-like shape at positions at which the first electrodes and the second electrodes intersect with each other.

According to a second aspect of the invention, there is provided the optical element according to the first aspect wherein the second electrodes are formed to cover upper faces and side faces of the organic layers.

According to a third aspect of the invention, there is provided the optical element according to the first aspect wherein a brightness signal circuit is connected to the first electrodes and a scanning circuit is connected to the second electrodes.

According to a fourth aspect of the invention, there is provided an optical element wherein first electrodes comprising a transparent conductive material are arranged on a substrate in a stripe-like shape, wherein organic layers including at least organic light emitting materials are formed above an insulating film having openings formed on the first electrodes, wherein second electrodes are formed on the organic layers to be substantially orthogonal to the first electrodes and wherein the organic layers are forme in an island-like shape at positions at which the first electrodes and the second electrodes intersect with each other.

According to a fifth aspect of the invention, there is provided the optical element according to the fourth aspect wherein the second electrodes are formed to cover upper faces and side faces of the organic layers.

According to a sixth aspect of the invention, there is provided the optical element according to the fourth aspect wherein the first electrodes are formed to extend in one direction, the second electrodes are formed to extend to other direction and when a width of the first electrodes in a direction orthogonal to the one direction is designated by a notation w1, a width of the opening in a direction orthogonal to the one direction is designated by a notation w2 and a width of the organic layers in a direction orthogonal to the one direction is designated by a notation w3, the following relationship is established.

$w1 \geq w3 > w2.$

According to a seventh aspect of the invention, there is provided the optical element according to the fourth aspect wherein a brightness signal circuit is connected to the first electrodes and a scanning circuit is connected to the second electrodes.

According to an eighth aspect of the invention, there is provided the optical element according to the fourth aspect wherein the first electrodes comprise ITO (indium tin oxide) and the second electrodes comprise Al. (aluminum).

According to a ninth aspect of the invention, the optical element according to the fourth aspect further comprises third electrodes disposed between the organic layers and the second electrodes and wherein the third electrodes are formed to cover upper faces and side faces of the organic layers.

According to a tenth aspect of the invention, there is provided the optical element according to the fourth aspect wherein the insulating layer is made of polyimide.

According to an eleventh aspect of the invention, there is provided the optical element according to the fourth aspect wherein the openings are formed in a rectangular shape.

According to a twelfth aspect of the invention, there is provided the optical element according to the fourth aspect wherein the organic layers include organic layers of red color, green color and blue color.

According to a thirteenth aspect of the invention, there is provided an optical element wherein a plurality of first electrodes comprising a transparent conductive material are arranged on a transparent substrate in a stripe-like shape, wherein organic layers including at least organic light emitting materials are formed on an insulating film having openings formed on the first electrodes, a plurality of second electrodes are formed on the organic layers to be substantially orthogonal to the first electrodes and wherein the organic layers are formed in an island-like shape only at positions at which the first electrodes and the second electrodes intersect with each other.

BRIEF DESCRIPTION OF THE DRAWINGS

FIGS. 1A and 1B are views showing an outline constitution of an embodiment of an optical element according to the invention in which

DETAILED DESCRIPTION OF THE PREFERRED EMBODIMENTS

A detailed explanation will be given of embodiments of the invention as follows.

Figure 1A:
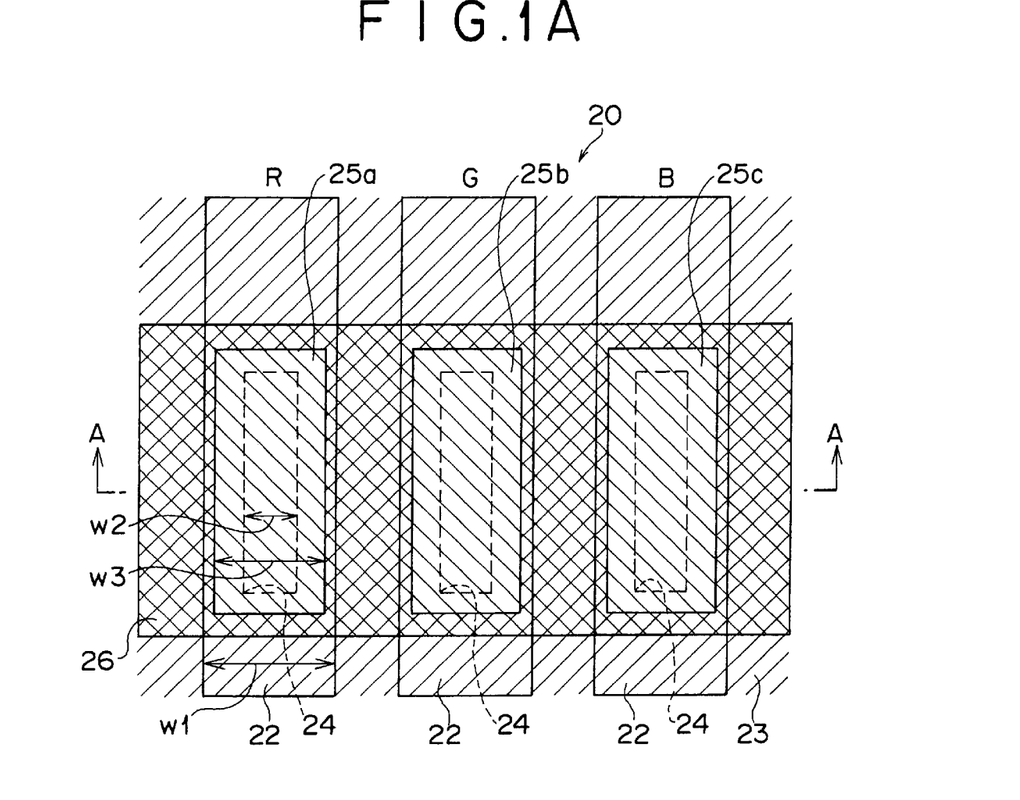
FIG. 1A is a plane view showing essential portions and FIG. 1B is a sectional view taken along a line A—A of FIG. 1A.
Figure 1B:
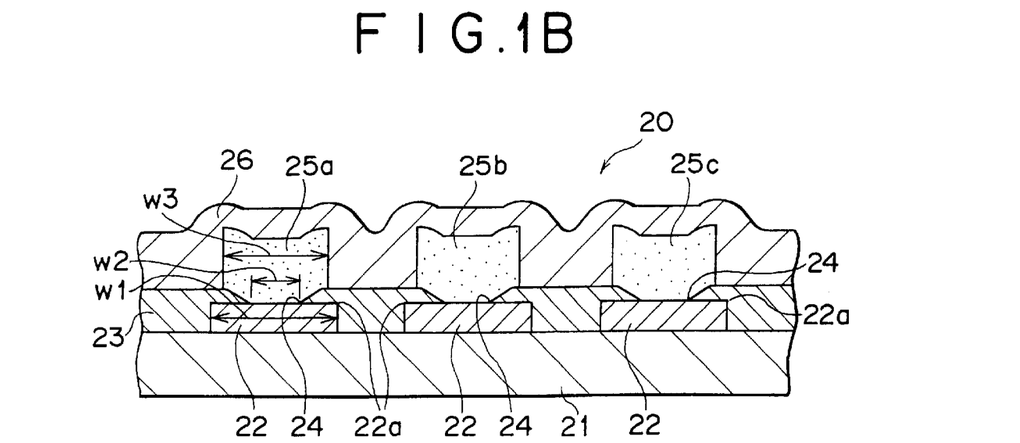

FIGS. 1A and 1B are views showing an outline constitution of an embodiment of an optical element according to the invention. In FIGS. 1A and 1B, numeral 20 designates an optical element applied to an organic EL display and numeral 21 designates a transparent substrate made of a light transmitting material such as glass.

According to the optical element 20, on the transparent substrate 21, as shown by FIG. 1B, a plurality of first electrodes 22 in a stripe-like shape comprising ITO are formed in parallel and an insulating layer 23 made of polyimide is formed to cover the first electrodes 22. In the insulating layer 23, right above the first electrodes 22, there are formed and arranged a number of openings 24 having a rectangular shape for making surfaces of the first electrodes 22 face outer side in a dot-like shape.

Further, on the first electrodes 22, there are installed organic layers 25a, 25b and 25c from insides of the openings 24 of the insulating layer 23 to the insulating layer 23. The organic layers 25a, 25b and 25c communicate with the first electrodes 22, that is, connected to the first electrodes 22 via the openings 24 and are formed in a rectangular shape larger than the openings 24 in plane view as shown by FIG. 1A. Further, all of the organic layers 25a, 25b and 25c are formed in an island-like shape independently from each other and are arranged within a width w1 of the first electrodes 22 in plane view. Further, the organic layers 25a, 25b and 25c are formed and arranged in correspondence with respectives of the openings 24 and are installed in a state of respectively covering corresponding ones of the openings 24.

Therefore, a plane view shape of the openings 24 is formed in a size smaller than a plane view shape of the organic layers 25a, 25b and 25c. As shown by FIGS. 1A and 1B, a width w2 of the opening 24 in a direction orthogonal to a longitudinal direction of the first electrode 22 is narrower than a width w3 of the organic layers 25a, 25b and 25c. Further, as mentioned above, the organic layers 25a, 25b and 25c are arranged within the width w1 of the first electrodes 22 in plane view and accordingly, a width w3 of the organic layers 25a, 25b and 25c is equal to or smaller than the width w1 of the first electrodes 22. Accordingly, a relationship of $w1 \geq w3 > w2$ is established among the width w1 of the first electrodes 22, the width w2 of the openings 24 and the width w3 of the organic layers 25a, 25b and 25c.

Further, from such a constitution, as shown by FIG. 1B, the organic layers 25a, 25b and 25c are not present directly above end portions 22a of the first electrodes 22 in the width direction and the insulating layer 23 is interposed therebetween.

Further, the organic layers 25a, 25b and 25c are respectively provided with light emitting layers comprising organic light emitting materials in correspondence with respective colors of red (R), green (G) and blue (B), are further provided with hole transport layers, electron transport layers, hole block layers and so on and are formed by laminating them. Further, according to the embodiment, the light emitting layer of the organic layer 25a corresponds to red color (R), the light emitting layer of the organic layer 25b corresponds to green color (G) and the light emitting layer of the organic layer 25c corresponds to blue color (B), respectively.

Further, above the transparent substrate 21, a plurality of second electrodes 26 in a stripe-like shape are formed in parallel and are arranged in a state of being substantially orthogonal to the first electrodes 22. The second electrodes 26 are of low resistance comprising a metal or an alloy having light shielding performance and according to the embodiment, the second electrodes 26 are made of aluminum. Further, the second electrodes 26 are formed to cover upper face sides of the organic layers 25a, 25b and 25c arranged on the first electrodes 22. Therefore, the organic layers 25a, 25b and 25c are arranged to be independent from each other respectively at positions where the first electrodes 22 and the second electrodes 26 intersect with each other.

In this case, according to the embodiment, as shown by FIG. 1B, the second electrodes 26 covering the upper face sides of the organic layers 25a, 25b and 25c are formed to cover not only the upper faces of the organic layers 25a, 25b and 25c but also side faces thereof exposed above the insulating layer 23. Thereby, as mentioned later, when each of the organic layers 25a, 25b and 25c generates light, the light is not transmitted to outer side from the upper face or the side faces but transmitted from its lower face to the transparent substrate 21 via the first electrode 22 which is a transparent electrode and is emitted further to the outer side.

Figure 2A:
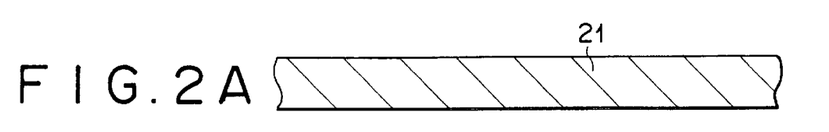
FIGS. 2A, 2B, 2C, 2D, 2E and 2F are side sectional views showing essential portions for explaining a method of fabricating the optical element shown by FIG. 1 in an order of steps.
Figure 2B:
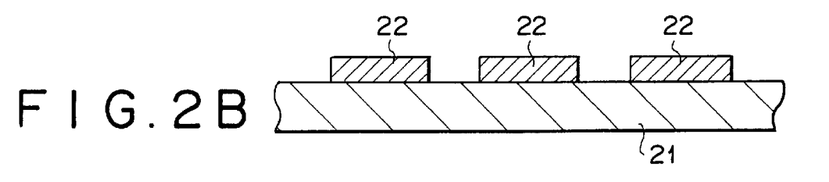

In forming the optical element 2 having such a constitution, firstly, as shown by FIG. 2A, the transparent substrate 21 comprising glass is prepared. Successively, on the transparent substrate 21, a film of a transparent conductive material excellent in light transmitting performance and having excellent conductivity or ITO in this embodiment is formed by a physical film forming process such as sputtering process and the first electrodes 22 in a stripe-like shape are formed as shown by FIG. 2B by using publicly-known lithography technology and etching technology. Further, in respect of dimensions of the first electrodes 22, according to the embodiment, the thickness is set to 200 nm and the width (w1) is set to 140 μm.

Figure 2C:
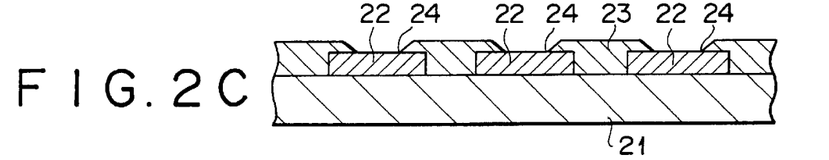

Next, in a state of covering the first electrodes 22, an insulating material or polyimide in this embodiment, is coated above the transparent substrate 21 by a thickness of about 1 μm by the spin coating process, successively, the openings 24 are formed on the first electrodes 22 as shown by FIG. 2C by using publicly-known lithography technology to thereby provide the insulating layer 23. In this case, in respect of the opening 24, according to the embodiment, a rectangular shape of 290 μm in length and 80 μm in width (width w2) is formed.

Further, polyimide is used for the insulating layer 23 since it has excellent insulating performance and excellent adhering performance in respect with a matrix. However, other material may naturally be used so far as it is an insulating material having such properties.

Figure 2D:
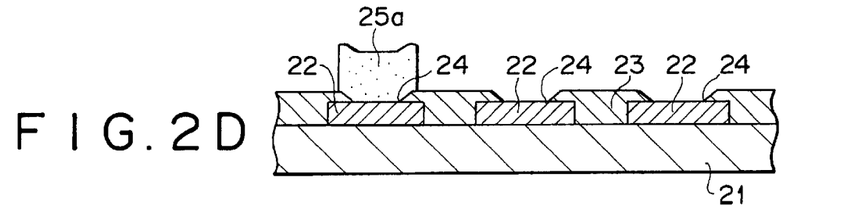
Figure 2E:
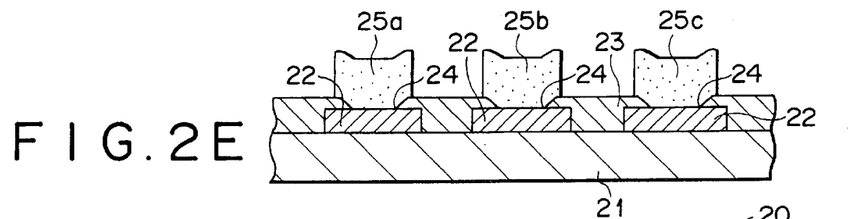

Next, as shown by FIG. 2D, the organic layers 25a of red color (R) are formed in the openings 24 and on the insulating film 23 at surroundings thereof by a vacuum vapor deposition process by using a vapor deposition mask arranged with a plurality of openings in a rectangular shape. Next, as shown by FIG. 2E, similar to formation of the organic layers 25a, the organic layers 25b of green color (G) and the organic layers 25c of blue color (B) are successively formed.

Further, in forming the organic layers 25a, 25b and 25c, vapor deposition is carried out by using vapor deposition masks in correspondence with the respective colors by respectively interchanging them or by moving the same vapor deposition mask. Accordingly, the provided organic layers 25a, 25b and 25c are formed to pile up in a rectangular shape in plane view independent from each other. According to the embodiment, there is provided a rectangular shape of 320 μm in length and 110μm in width (width w3). Therefore, the above-described relationship among the width w1 of the first electrodes 22, the width w2 of the openings 24 and the width w3 of the organic layers 25a, 25b and 25c, that is, the relationship of w1 (=140 μm)≧w3(=110 μm)>w2(=80 μm) is satisfied.

Further, according to the embodiment, thicknesses of the organic layers 25a, 25b and 25c are constituted to differ from each other such that the thickness of the red organic layer 25a is 150 nm, the thickness of the green organic layer 25b is 100 nm and the thickness of the blue organic layer 25c is 200 nm.

Figure 2F:
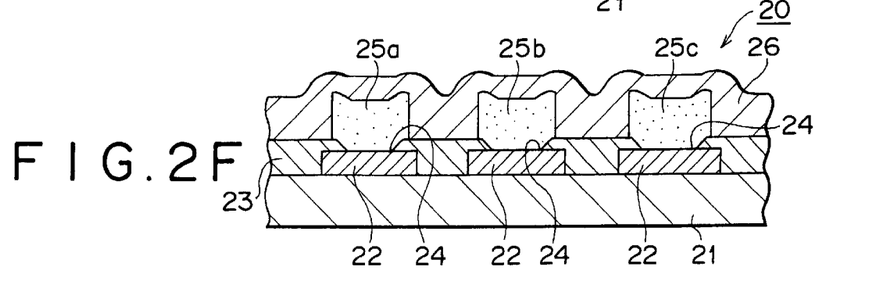

Next, as shown by FIG. 2F, the second electrodes 26 in a stripe-like shape are formed by the physical forming process of sputtering process or vapor deposition process or the like by using a vapor deposition mask having openings in a stripe-like shape to be substantially orthogonal to the first electrodes 22 and in a state of covering the organic layers 25a, 25b and 25c as shown by FIG. 1A. According to the embodiment, there are provided the second electrodes 26 made of aluminum in a stripe-like shape having the thickness of 300 nm and the width of 440 μm.

Thereafter, an insulating layer (illustration is omitted) and so on are formed to cover the second electrodes 26 to thereby provide the optical element 20 of full color.

Further, as the method of forming the organic layers 25a, 25b and 25c and the second electrodes 26, in place of the vapor deposition mask process, other patterning process, for example, a method of using lithography technology and etching technology or the like may be used.

Figure 3:
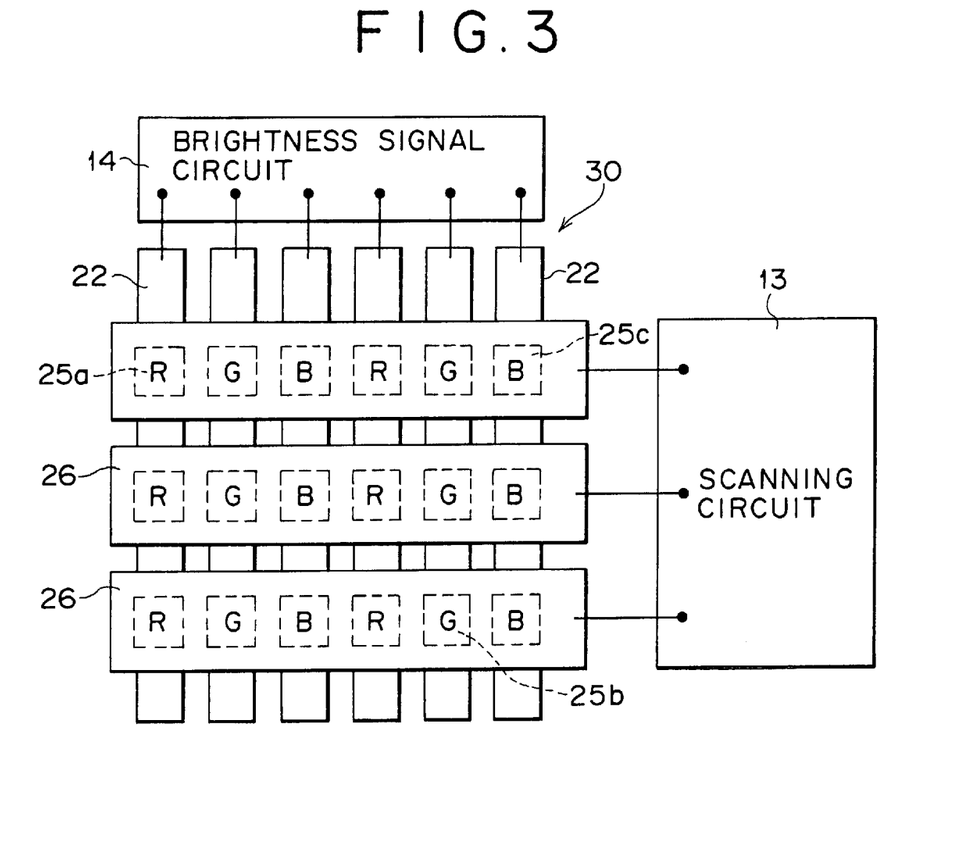
FIG. 3 is a connection diagram of a drive circuit in an example in which the optical element shown by FIG. 1 constitutes an organic EL display.

According to the optical element 20, the organic layers 25a, 25b and 25c are formed in an island-like shape independently from each other. Therefore, when the optical element 20 is driven by the simple matrix system, for example, as shown by FIG. 3, an organic EL display 30 is constituted by connecting a brightness signal circuit 14 to the side of the first electrodes 22 and connecting the scanning circuit 23 to the side of the second electrodes 26.

When the organic EL display 30 is constituted in this way, and driven by the simple matrix system by connecting the brightness signal circuit 14 and the scanning circuit 13 to the respective electrodes, voltage drop in the first electrodes 22 which are transparent electrodes can be reduced by which voltage applied on the organic layers 25a, 25b and 25c constituting the respective pixels can be made substantially uniform and the light emitting brightness can be made uniform.

Further, power consumed in the first electrodes 22 can be made negligibly small and accordingly, power consumption can be reduced.

Figure 4:
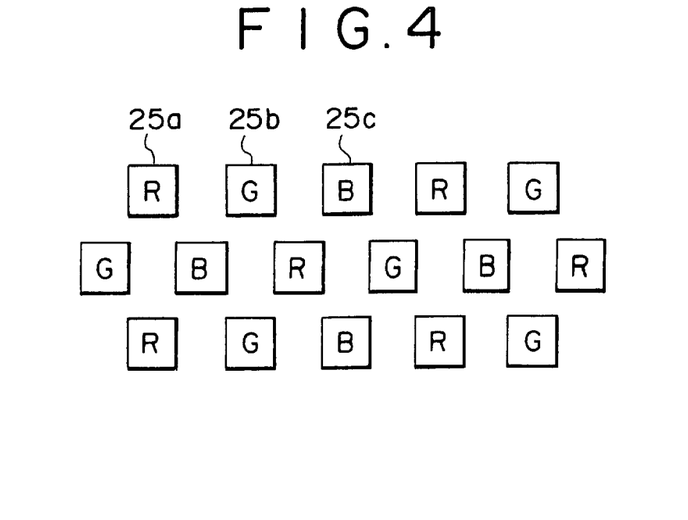
FIG. 4 is plane view showing a modified example of pixel arrangement in the optical elements according to the invention.

Further, according to the above-described optical element 20, the organic layers 25a, 25b and 25c are formed in an island-like shape independently from each other. Therefore, arrangement of the organic layers 25a, 25b and 25c become arbitrary and therefore, the arrangement of the unit pixels constituted by the respective organic layers 25a, 25b and 25c can arbitrarily be constituted, therefore, the pixels in correspondence with respective colors of red color (R), green color (G) and blue color (B) can also be arranged in a delta shape as shown by FIG. 4.

Figure 5:
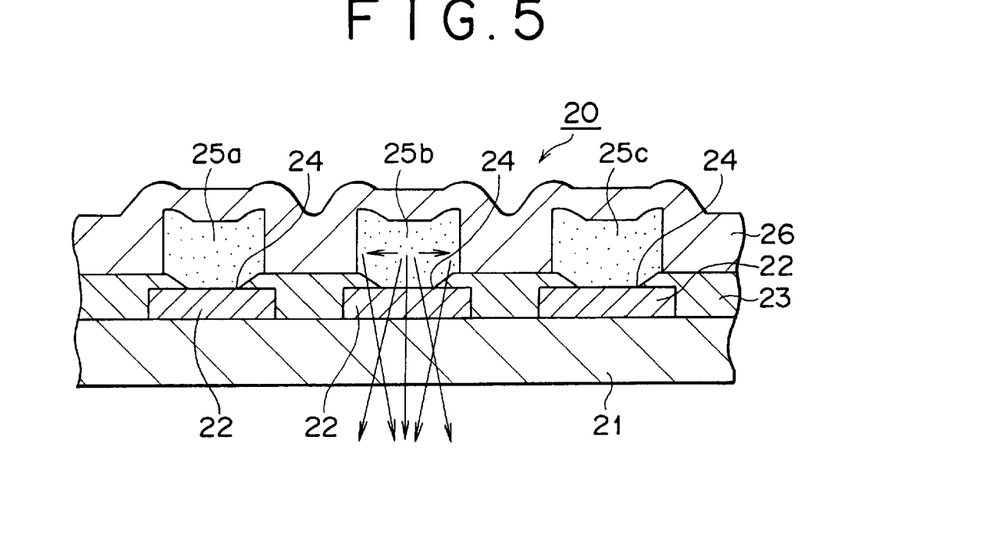
FIG. 5 is a side sectional view showing essential portions for explaining operation of the optical element shown by FIG. 1.

Further, according to the above-described optical element 20, the organic layers 25a, 25b and 25c are formed in an island-like shape independently from each other and the upper face side, that is, upper faces and side faces of the organic layers 25a, 25b and 25c are covered by the second electrodes 26. Accordingly, as shown by arrow marks in FIG. 5, when the organic layer 25b (25a, 25c) generates light, the light is reflected without being transmitted to the outer side from the upper face or the side faces, as a result, almost all of the light is transmitted from the lower face of the organic layer to the transparent substrate 21 via the first electrode 22 which is a transparent electrode and is emitted to the outer side.

Accordingly, light generated by the organic layers 25a, 25b and 25c can effectively be utilized by which there can be carried out a display having higher brightness and more excellent color reproducing performance. In this case, such an effect is achieved not only for color display but similarly for monochromatic display.

Further, according to the above-described element 20, the insulating layer 23 having the openings 24 are provided between the first electrodes 22 and the organic layers 25a, 25b and 25c and the opening 24 are formed in a size smaller than the plane view shape of the organic layers 25a, 25b and 25c. Therefore, the organic layers 25a, 25b and 25c are not directly present particularly above the end portions 22a in the width direction of the first electrodes 22 and the insulating layer 23 is interposed therebetween, accordingly, shortcircuit between the first electrodes 22 and the second electrodes 26 directly formed thereabove is prevented and the pixels can firmly be selected.

Further, according to the above-described optical element 20, in a state of plane view, the organic layers 25a, 25b and 25c are arranged within the width of the first electrodes 22 and accordingly, the width w3 of the organic layers 25a, 25b and 25c is made equal to or smaller than the width w1 of the first electrodes 22 (w1≧w3). Therefore, in designing, the width w1 of the first electrodes 22 can relatively be increased by which a reduction in the wiring resistance of the first electrode can be achieved.

Figure 6:
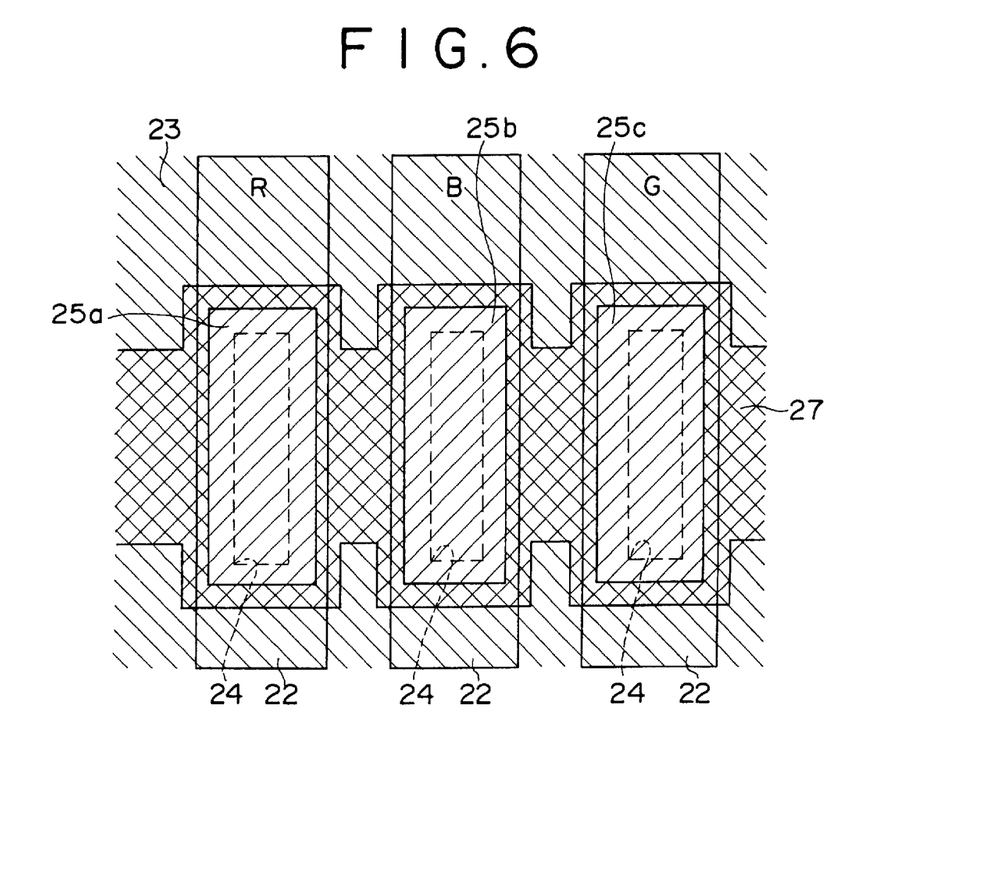
FIG. 6 is a plane view showing a modified example of an optical element according to the invention.

Further, although according to the above-described embodiment, the second electrodes 26 are formed in a stripe-like shape having the same width over an entire constitution, the present invention is not limited thereto but, otherwise, for example, as shown by FIG. 6, there may be constituted second electrodes 27 in a stripe-like shape in which the widths are partially narrowed. However, also in this case, it is preferable to constitute a plane view shape such that the upper face sides of the organic layers 25a, 25b and 25c can be covered by the second electrodes 27.

Figure 7:
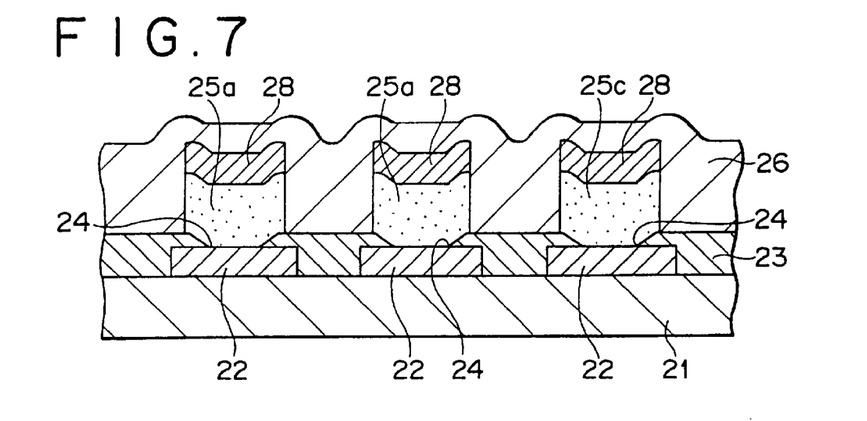
FIG. 7 is a plane view showing a modified example of an optical element according to the invention.
Figure 8:
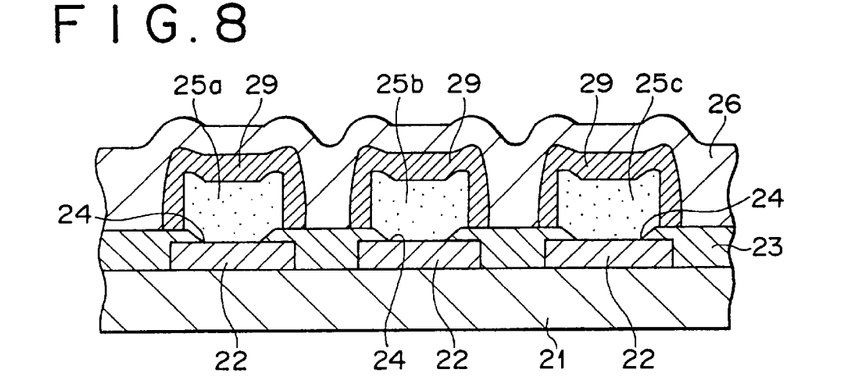
FIG. 8 is a plane view showing a modified example of an optical element according to the invention.

Further, although according to the above-described embodiment, the second electrodes 26 are provided directly on the organic layers 25a, 25b and 25c, as shown by FIG. 7, metal films 28 having a size substantially the same as the upper face shape of the organic layers 25a, 25b and 25c may be installed thereabove and the second electrodes may be installed thereabove. Further, as shown by FIG. 8, metal films 29 having a shape exactly covering the upper faces and side faces of the organic layers 25a, 25b and 25c may be installed thereon and the second electrodes 26 may be installed thereon.

Further, the metal films 28 or the metal films 29 may be made to function as the second electrodes. In this case, electrodes formed on the metal films 28 or 29 constitute wirings for conducting electricity to the metal films 28 or 29. In respect of the wirings, the shape and the dimensions are arbitrary and the wirings may naturally be made smaller than the size of the organic layers 25a, 25b and 25c.

Further, according to the invention, also in respect of the opening 24 of the insulating layer and the organic laminated members 25a, 25b and 25c, the dimensions and shapes are not limited to those in the above-described embodiments but are arbitrary. Naturally, in respect of individual ones of the openings 24 and the organic laminated members 25a, 25b and 25c, the sizes or shapes may be changed in accordance with forming positions or colors.

Further, although according to the above-described embodiments, an explanation has been given of an example in the case in which the optical element according to the invention is applied to a color organic EL display, the present invention is applicable also to a monochromatic organic EL display and is further applicable not to the organic EL display under the simple matrix drive system but an organic EL display by an active matrix system driven by TFTs (thin film transistor) or the like.

Further, the optical element according to the invention can also be utilized as a light source of a dial or the like and in that case, the optical elements need not to arrange in a matrix-like shape. Further, the optical element is applicable also to a spontaneous light emitting element for a filter adjusting chromaticity or optical communication apparatus or the like and is further applicable to an image taking element or the like as an application when incident light is converted into electric signal.

As has been explained above, according to the optical element of the invention, a plurality of organic layers are provided in a state of being independent from each other in an island-like shape and accordingly, arrangement and combination of organic layers, cathodes and anodes can arbitrarily be carried out by which selection and arrangement of pixels comprising the organic EL elements and electrodes forming constituent elements of the elements become arbitrary and accordingly, the second electrodes comprising a metal or an alloy having small resistance can be used for electrodes on the scanning side where the larger current flows.

Further, the organic layer is arranged within the width of the first electrode in the plane view state and accordingly, the width of the first electrode can be made relatively large in design by which the wiring resistance of the first electrode can be reduced and accordingly, a reduction in power consumption can be achieved.

Further, there is installed the insulating layer having the openings for communicating the first electrodes with the organic layers are installed between the first electrodes and the organic layers and the openings are formed in a size smaller than the plane view shape of the organic layers and accordingly, particularly, the organic layers are not present directly above end portions in the width direction of the first electrodes but the insulating layer is interposed therebetween, therefore, shortcircuit between the first electrodes and the second electrodes directly formed thereabove is prevented and pixels can be selected firmly.

Further, the first electrodes and the second electrodes are formed respectively in a stripe-like shape and are arranged substantially orthogonally to each other, the organic layers are provided at positions intersecting with these in an island-like shape independently from each other. Therefore, when the upper face sides of the organic layers are formed in a state of being covered by the second electrodes, light generated at the organic layers are not guided to other ones of the organic layers but can be taken out efficiently from the transparent substrate side as display light.

According to the organic EL display of the invention, the plurality of organic layers are provided in a state of being independent from each other in an island-like shape and accordingly, arrangement and combination of the organic layers, the cathodes and the anodes can arbitrarily be carried out by which selection and arrangement of the pixels comprising the organic EL elements and electrodes constituting the constituent elements of the elements can arbitrarily be carried out and therefore, there can be constituted the second electrodes made of a metal or an alloy having small resistance by electrodes on the scanning circuit side where the larger current flows.

Further, large current can be prevented from flowing in the first electrodes comprising a transparent conductive material having large resistance by such a constitution by which nonuniformity of light generation of respective pixels caused by voltage drop can be minimized and accordingly, deterioration in the display function can be prevented.

Further, large current is not flowed in the first electrodes having large resistance and therefore, power consumed there is reduced and accordingly, low power consumption can be achieved.

Further, the plurality of organic layers are provided in a state of being independent from each other in an island-like shape by which arrangement and combination of the organic layers, the cathodes and the anodes can arbitrarily be carried out and accordingly, for example, in a color organic EL display, pixels respectively in correspondence with red (R), green (G) and blue (B) can arbitrarily be arranged and accordingly, for example, a delta arrangement can also be constituted.

Further, the first electrodes and the second electrodes can be formed respectively in a stripe-like shape and are arranged substantially orthogonally to each other and organic layers are provided independently from each other in an island-like shape at positions intersecting with these and accordingly, when the upper face sides of the organic layers are formed in a state of being covered by the second electrodes, light generated at the organic layers is not guided to other ones of the organic layers but can efficiently be taken out from the side of the transparent substrate as display light.

Further, light generated in the organic layers can efficiently be taken out as display light in this way and accordingly, drive voltage or drive current can be reduced by which a display having higher brightness, longer life and lower power consumption and higher reliability can be realized.

Further, light generated in the organic layer does not reach other pixel by being guided in the organic layer and accordingly, deterioration of color reproduction caused by cross talk can be prevented and accordingly, there can be realized a display having high function excellent in color reproducing performance.

What is claimed is:

1. An optical element comprising:
   first electrodes comprising a transparent conductive material arranged on a substrate in a stripe-like shape;
   organic layers including at least organic light emitting materials formed above an insulating film having openings formed on said first electrodes;
   second electrodes formed on said organic layers substantially orthogonal to said first electrodes;
   wherein said organic layers are formed in an island-like shape at positions at which said first electrodes and said second electrodes intersect with each other; and
   said first electrodes are formed to extend in one direction, said second electrodes are formed to extend to other direction and when a width of said first electrodes in a direction orthogonal to be one direction is designated by a notation w1, a width of said openings in a direction orthogonal to the one direction is designated by a notation w2 and a width of said organic layers in a direction orthogonal to the one direction is designated by a notation w3, the following relationship is established;

$w1 \geq w3 > w2.$

2. An optical element comprising:
   a plurality of first electrodes comprising a transparent conductive material arranged on a transparent substrate in a strip-like shape;
   organic layers including at least organic light emitting materials formed on an insulating film having openings formed on said first electrodes;
   a plurality of second electrodes formed on said organic layers substantially orthogonal to said first electrodes; and
   said organic layers formed in an island-like shape only at positions at which said first electrodes and said second electrodes intersect with each other;
   wherein said first electrodes are formed to extend in one direction, said second electrodes are formed to extend to other direction and when a width of said first electrodes in a direction orthogonal to the one direction is designated by a notation w1, a width of said openings in a direction orthogonal to the one direction is designated by a notation w2 and a width of said organic layers in a direction orthogonal to the one direction is designated by a notation w3, the following relationship is established;

$w1 \geq w3 > w2.$

3. An optical element comprising:
   first electrodes comprising a transparent conductive material arranged on a substrate in a stripe-like shape;
   organic layers including at least organic light emitting materials formed above an insulating film having openings formed on said first electrodes;
   second electrodes formed on said organic layers substantially orthogonal to said first electrodes;
   wherein said organic layers are formed in an island-like shape at positions at which said first electrodes and said second electrodes intersect with each other; and
   third electrodes disposed between the organic layers and the second electrodes; and
   wherein said third electrodes are formed to cover upper faces and side faces of said organic layers.

4. An optical element comprising:
   a plurality of first electrodes comprising a transparent conductive material arranged on a transparent substrate in a strip-like shape;
   organic layers including at least organic light emitting materials formed on an insulating film having openings formed on said first electrodes;
   a plurality of second electrodes formed on said organic layers substantially orthogonal to said first electrodes; and
   said organic layers formed in an island-like shape only at positions at which said first electrodes and said second electrodes intersect with each other;
   third electrodes disposed between the organic layers and said second electrodes; and
   wherein said third electrodes are formed to cover upper faces and side faces of said organic layers.

5. An optical element comprising:
   first electrodes formed on a substrate;
   organic layers at least including organic light emitting materials formed on the first electrodes;
   second electrodes formed on the organic layers;
   said first electrodes and said second electrodes being formed to be substantially orthogonal to each other; and said organic layers being formed in an island-like shape at positions at which said first electrodes and said second electrodes intersect with each other;

wherein a brightness signal circuit is connected to said first electrode and a scanning circuit is connected to said second electrodes.

6. An optical element as claimed in claim 5, wherein said second electrodes are formed to cover upper faces and side faces of said organic layers.

7. An optical element comprising:

a plurality of first electrodes comprising a transparent conductive material arranged on a transparent substrate in a strip-like shape;

organic layers including at least organic light emitting materials formed on an insulating film having openings formed on said first electrodes;

a plurality of second electrodes formed on said organic layers substantially orthogonal to said first electrodes; and said organic layers formed in an island-like shape only at positions at which said first electrodes and said second electrodes intersect with each other;

wherein said electrodes are formed to cover upper faces and side faces of said organic layers, and wherein said first electrodes are formed to extend in one direction, said second electrodes are formed to extend to other direction and when a width of said first electrodes in a direction orthogonal to the one direction is designated by a notation w1, a width of said openings in a direction orthogonal to the one direction is designated by a notation w2 and a width of said organic layers in a direction orthogonal to the one direction is designated by a notation w3, the following relationship is established;

$$w1 \geq w3 > w2.$$

8. An optical element as claimed in claim 7, further comprising:

third electrodes disposed between said organic layers and said second electrodes; and wherein said third electrodes are formed to cover upper faces and side faces of said organic layers.

9. An optical element wherein:

a plurality of first electrodes comprising a transparent conductive material are arranged on a transparent substrate in a stripe-like shape;

organic layers including at least organic light emitting materials are formed on an insulating film having openings formed on said first electrodes;

a plurality of second electrodes are formed on said organic layers to be substantially orthogonal to said first electrodes; and said organic layers are formed in an island-like shape only at positions at which said first electrodes and said second electrodes intersect with each other, wherein a brightness signal circuit is connected to said first electrodes and a scanning circuit is connected to said second electrodes.

10. An optical element as claimed in claim 9, wherein said second electrodes are formed to cover upper faces and side faces of said organic layers.

11. An optical element as claimed in claim 9, wherein said first electrodes comprise ITO (indium tin oxide) and said second electrodes comprise Al (aluminum).

12. An optical element wherein:

first electrodes comprising a transparent conductive material are arranged on a substrate in a stripe-like shape;

organic layers including at least organic light emitting materials are formed above an insulating film having openings formed on said first electrodes;

second electrodes are formed on said organic layers to be substantially orthogonal to said first electrodes; and said organic layers are formed in an island-like shape at positions at which said first electrodes and said second electrodes intersect with each other, wherein a brightness signal circuit is connected to said first electrodes and a scanning circuit is connected to said second electrodes.

13. An optical element as claimed in claim 12, wherein said second electrodes are formed to cover upper faces and side faces of said organic layers.

14. An optical element as claimed in claim 12, wherein said first electrodes comprise ITO (indium tin oxide) and said second electrodes comprise Al (aluminum).

15. An optical element as claimed in claim 12, wherein said insulating layer is made of polyimide.

16. An optical element as claimed in claim 12, wherein said openings are formed in a rectangular shape.

17. An optical element as claimed in claim 12, wherein said organic layers include organic layers of red color, green color and blue color.

* * * * *